(12) United States Patent
Nakaya

(10) Patent No.: US 6,339,290 B1
(45) Date of Patent: Jan. 15, 2002

(54) ORGANIC ELECTROLUMINESCENT DEVICE AND MAKING METHOD

(75) Inventor: Kenji Nakaya, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/379,112

(22) Filed: Aug. 23, 1999

(30) Foreign Application Priority Data

Aug. 21, 1998 (JP) .......................................... 10-252057

(51) Int. Cl.[7] ................................................ H01J 17/49
(52) U.S. Cl. ........................ 313/506; 313/498; 313/503
(58) Field of Search ................................. 313/506, 498, 313/503, 507, 508, 509, 504, 505

(56) References Cited

U.S. PATENT DOCUMENTS

| 3,935,031 A | | 1/1976 | Adler | |
|---|---|---|---|---|
| 4,356,429 A | | 10/1982 | Tang | |
| 5,458,977 A | | 10/1995 | Hosokawa et al. | |
| 5,932,363 A | * | 10/2000 | Hu et al. | 313/504 |
| 6,140,763 A | * | 10/2000 | Hung et al. | 313/506 |

FOREIGN PATENT DOCUMENTS

| EP | 0 704 915 | 4/1996 |
|---|---|---|
| EP | 0 917 216 | 5/1999 |
| EP | 0 977 287 | 2/2000 |
| JP | 10-223372 | 8/1998 |
| JP | 10-321374 | 12/1998 |
| JP | 11-16681 | 1/1999 |
| WO | WO 98/24272 | 6/1998 |
| WO | WO 99/20081 | 4/1999 |

OTHER PUBLICATIONS

V. Bulovic, et al., Appl. Phys. Lett., vol. 70, No. 22, pp. 2954–2956, "A Surface–Emitting Vacuum–Deposited Organic Light Emitting Device", Jun. 2, 1997.

G. Parthasarathy, et al., Appl. Phys. Lett., vol. 72, No. 17, pp. 2138–2140, "A Metal–Free Cathode for Organic Semiconductor Devices", Apr. 27, 1998.

* cited by examiner

Primary Examiner—Vip Patel
(74) Attorney, Agent, or Firm—Oblon, Spivak, McClelland, Maier & Neustadt, P.C.

(57) ABSTRACT

In an organic EL device comprising on a substrate (1), a hole injecting electrode (2), an organic layer (4) having a light emitting function, a buffer layer (6), and an electron injecting electrode (7), the electron injecting electrode (7) is constructed of a metal, metal oxide or metal halide, especially Al—Li alloy, and the buffer layer (6) is constructed of a porphyrin or naphthacene compound. The device can be manufactured without damages to the organic layer and has a low initial drive voltage, a low emission start voltage, a high efficiency, and minimized dark spot growth and hence a long lifetime.

8 Claims, 2 Drawing Sheets

ORGANIC ELECTROLUMINESCENT DEVICE AND MAKING METHOD

This invention relates to an organic electroluminescent (EL) device and more particularly, to a structure suitable for use in a device of the type wherein an electric field is applied to a thin film of an organic compound to emit light.

BACKGROUND OF THE INVENTION

Active research works have been made on organic EL devices for use as displays because EL devices can be formed on a large area of glass. In general, organic EL devices have a basic configuration including a glass substrate, a transparent electrode of tin-doped indium oxide (ITO) etc., a hole transporting layer of an organic amine compound, a light emitting layer of an organic luminescent material exhibiting electron conductivity and intense light emission such as an aluminum quinolinol complex (Alq3), and an electrode of a metal having a low work function such as MgAg, wherein the layers are stacked on the substrate in the described order.

The device configurations which have been reported thus far have one or more organic compound layers interposed between a hole injecting electrode and an electron injecting electrode. Structures having two or three organic compound layers are typical.

Included in the two-layer structure are a structure having a hole transporting layer and a light emitting layer formed between the hole injecting electrode and the electron injecting electrode and another structure having a light emitting layer and an electron transporting layer formed between the hole injecting electrode and the electron injecting electrode. Included in the three-layer structure is a structure having a hole transporting layer, a light emitting layer, and an electron transporting layer formed between the hole injecting electrode and the electron injecting electrode. Also known is a one-layer structure wherein a single layer playing all the roles is formed from a polymer or a mixed system.

FIGS. 3 and 4 illustrate typical configurations of organic EL devices.

In FIG. 3, a hole transporting layer 14 and a light emitting layer 15, both of organic compounds, are formed between a hole injecting electrode 12 and an electron injecting electrode 13 on a substrate 11. In this configuration, the light emitting layer 15 also serves as an electron transporting layer.

In FIG. 4, a hole transporting layer 14, a light emitting layer 15, and an electron transporting layer 16, all of organic compounds, are formed between a hole injecting electrode 12 and an electron injecting electrode 13 on a substrate 11.

Reliability is a common problem to be solved for these organic EL devices. More particularly, organic EL devices in principle have a hole injecting electrode and an electron injecting electrode and need a light emitting layer of organic material or organic layers for effectively injecting and transporting holes and electrons from the electrodes, respectively. However, the organic materials of which the organic layers are formed are vulnerable during manufacture and have less affinity to the electrodes. Another problem is raised by the significantly accelerated degradation of organic thin films as compared with inorganic thin films as in light emitting diodes (LED) and laser diodes (LD).

As the material of which the electron injecting electrode of the organic EL device is made, metals, metal oxides, and metal halides (typically metal fluorides) are promising because of their electron injecting efficiency. When the electron injecting electrode is formed by sputtering, its adhesion to the underlying organic layer is improved. However, the sputtering technique can do more damages to the organic layer than evaporation and other deposition techniques, causing development of non-light-emitting regions, known as dark spots, and current leakage. It also raises such problems as an increased initial drive voltage and an increased emission start voltage (or threshold voltage).

SUMMARY OF THE INVENTION

An object of the present invention is to provide an organic EL device which can be manufactured without damages to the organic layer and has minimized development of dark spots, a low initial drive voltage, a low emission start voltage, a high efficiency, and a long lifetime.

As disclosed in WO 98/24272 (International Application PCT/JP 97/04407, U.S. Ser. No. 08/984,087, EP 97 946073.0), Japanese patent application No. 9-128001 (U.S. Ser. No. 09/066,775, EP 98 303309.3) and Japanese Patent Application No. 9-145808 (U.S. Ser. No. 09/079,286, EP 98 303833.2), we found that organic EL devices having improved characteristics are obtained when an electron injecting electrode is made of a metal material, especially Al—Li alloy. However, when a metallic electron injecting electrode is used, it is difficult to find a trade-off between the adhesion and the damage of the electrode to the underlying organic layer. This problem must be solved before an organic EL device of better performance can be realized.

We have found that the problem can be solved by forming a layer of a porphyrin compound such as phthalocyanine or a naphthacene compound as a buffer layer between the electron injecting layer and the organic layer.

It is noted that Appl. Phys. Lett., Vol. 70, No. 22, 2 June 1997, "A surface-emitting vacuum-deposited organic light emitting device," V. Bulovic, P. Tian, P. E. Burrows, M. R. Gokhale and S. R. Forrest and Appl. Phys. Lett., Vol. 72, No. 17, 27 April 1998, "A metal-free cathode for organic semi-conductor devices," G. Parthasarathy, P. E. Burrows, V. Khalfin, V. G. Kozlov and S. R. Forrest report a device (OILED) having 3,4,9,10-perylenetetracarboxylic dianhydride (PTCDA) or copper phthalocyanine (CuPc) deposited between a hole injecting electrode of ITO and an organic layer of TPD and a device (TOLED) having copper phthalocyanine (CuPc) deposited between an electron injecting electrode of ITO and an organic layer of Alq3, respectively. It is described that the layer of copper phthalocyanine or the like has the function of protecting the organic layer from being damaged during deposition of ITO.

The devices reported in the literature, however, use ITO as the hole injecting electrode or electron injecting electrode. No study was made on the use of metals, metal oxides or metal halides as the electron injecting electrode. According to our experiment, a device using ITO as the electron injecting electrode is difficult to achieve practically acceptable performance because of an extremely low electron injecting efficiency. Therefore, the devices reported in the literature and the organic EL device using an electron injecting electrode of metal material according to the invention are completely different in function and effect, and the contents in the literature do not constitute the prior teachings from which the present invention is conceivable.

In a first aspect, the invention provides an organic electroluminescent (EL) device comprising a substrate, a hole injecting electrode and an electron injecting electrode on the substrate, an organic layer participating in at least a light emitting function disposed between the electrodes, and a buffer layer disposed between the organic layer and the electron injecting electrode. The electron injecting electrode is constructed of a metal, metal oxide or metal halide, and the buffer layer is constructed of a porphyrin or naphthacene compound.

In a second aspect, the invention provides a method for preparing an organic EL device comprising the steps of forming a hole injecting electrode on a substrate, forming thereon at least one organic layer participating in at least a light emitting function, forming thereon a buffer layer comprising a porphyrin or naphthacene compound, and forming thereon an electron injecting electrode.

Preferably, the electron injecting electrode is formed by sputtering and composed of an aluminum-lithium alloy containing 0.4 to 14 at % of lithium, more preferably 6.5 to 14 at % of lithium. The buffer layer typically has a thickness of 0.1 to 20 nm.

DESCRIPTION OF THE PREFERRED EMBODIMENTS

Figure 1:
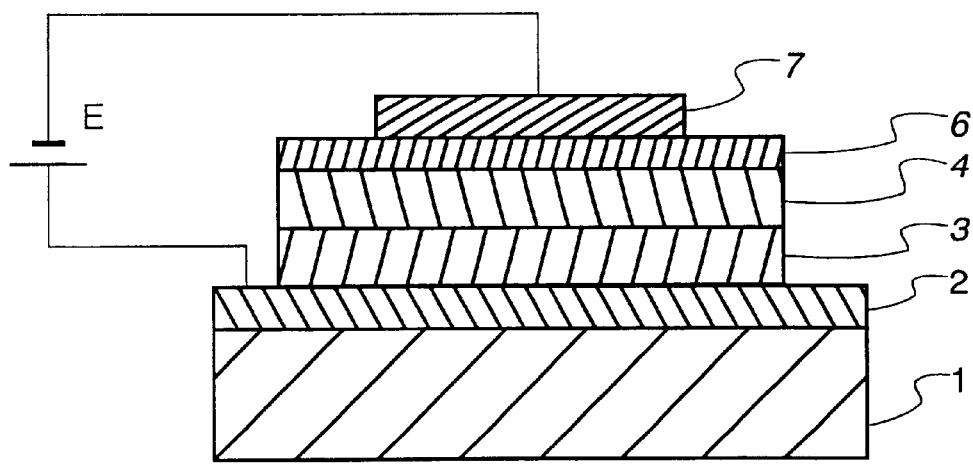
FIG. 1 is a schematic cross-sectional view illustrating the configuration of an organic EL device according to one embodiment of the invention.

The organic EL device of the invention has a hole injecting electrode and an electron injecting electrode on a substrate, and an organic layer participating in at least a light emitting function disposed between the electrodes. The device further has a buffer layer comprising a porphyrin or naphthacene compound disposed between the organic layer and the electron injecting electrode.

By providing a buffer layer comprising a porphyrin or naphthacene compound between the organic layer and the electron injecting electrode, the organic layer is prevented from being damaged during deposition of the electron injecting electrode. The buffer layer becomes effective particularly when the electron injecting electrode is deposited by sputtering. When the electron injecting electrode is deposited by sputtering, the buffer layer accommodates damages and protects the interface with the underlying organic layer or the organic layer itself. The buffer layer comprising a porphyrin or naphthacene compound insures or maintains the electron injecting and transporting function.

The porphyrin compounds in the buffer layer may be those of the types disclosed in Adler, U.S. Pat. No. 3,935,031 and Tang, U.S. Pat. No. 4,356,429. Illustratively, porphyrin compounds of the following structural formula (I) are preferred.

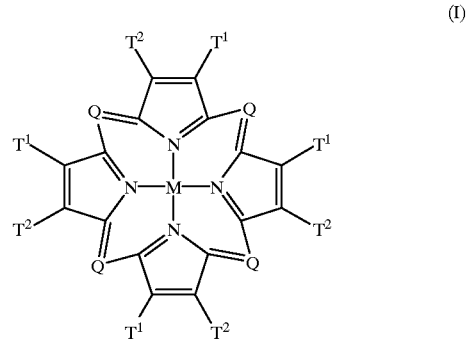

(I)

In formula (I), Q is —N= or —C(R)=; M is a metal, metal oxide or metal halide; R is alkyl, aralkyl, aryl or alkaryl; $T^1$ and $T^2$ are hydrogen or together form an unsaturated 6-membered ring which may have at least one substituent such as alkyl or halogen. The preferred 6-membered ring is formed by ring atoms including carbon, sulfur and nitrogen atoms. The preferred alkyl moiety has 1 to 6 carbon atoms, and phenyl is the preferred aryl moiety.

Also useful are compounds wherein the metal atom in formula (I) is replaced by two hydrogen atoms, as shown by following structural formula (II).

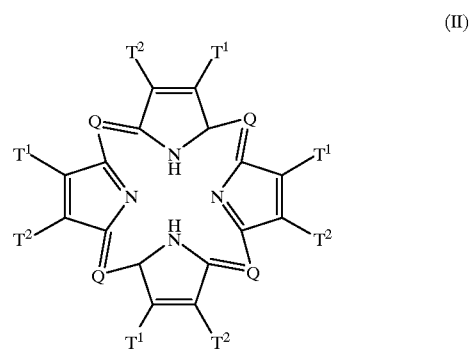

(II)

Highly preferred examples of useful porphyrins are metal-free phthalocyanines and metal phthalocyanines. The porphyrinic compounds in general and the metal phthalocyanines in particular can contain any metal while the metal preferably has a positive valence number of 2 or higher. Preferred exemplary metals are copper, lead, platinum, cobalt, magnesium, zinc, palladium, and nickel, with copper, lead, zinc and platinum being especially preferred.

Illustrative examples of useful porphyrins include PC-1; porphine, PC-2; 1,10,15,20-tetraphenyl-21H,23H-porphyn copper(II), PC-3; 1,10,15,20-tetraphenyl-21H,23H-porphyn zinc(II), PC-4; 5,10,15,20-tetrakis(pentafluorophenyl)-21H, 23H-porphyn, PC-5; silicon phthalocyanine oxide, PC-6; aluminum phthalocyanine chloride, PC-7; metal-free phthalocyanine, PC-8; dilithium phthalocyanine, PC-9; copper tetramethylphthalocyanine, PC-10; copper phthalocyanine, PC-11; chromium phthalocyanine, fluoride PC-12; zinc phthalocyanine, PC-13; lead phthalocyanine, PC-14; titanium phthalocyanine, oxide PC-15; magnesium phthalocyanine, and PC-16; copper octamethylphthalocyanine.

The naphthacene compounds preferably have a basic skeleton of the following formula (III).

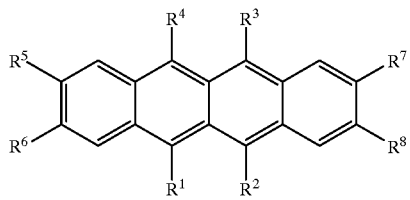

(III)

In formula (III), $R^1$ to $R^4$ represent substituted or unsubstituted alkyl, aryl, amino, heterocyclic or alkenyl groups, preferably aryl, amino, heterocyclic or alkenyl groups.

The aryl groups represented by $R^1$ to $R^4$ may be monocyclic or polycyclic and include fused rings and ring assemblies. Each aryl group preferably has 6 to 30 carbon atoms in total and may have a substituent or substituents. Preferred examples of the aryl groups represented by $R^1$ to $R^4$ include phenyl, o-, m- or p-tolyl, pyrenyl, perylenyl, coronenyl, 1- or 2-naphthyl, anthryl, o-, m- or p-biphenylyl, terphenyl and phenanthryl.

The amino groups represented by $R^1$ to $R^4$ may be alkylamino, arylamino or aralkylamino groups. These groups preferably have an aliphatic moiety of 1 to 6 carbon atoms in total and/or 1 to 4 aromatic carbocycles. Preferred examples of the amino groups include dimethylamino, diethylamino, dibutylamino, diphenylamino, ditolylamino, bisdiphenylylamino, and bisnaphthylamino groups.

The heterocyclic groups represented by $R^1$ to $R^4$ include 5- or 6-membered aromatic heterocyclic groups containing O, N or S as the hetero atom and fused polycyclic aromatic heterocyclic groups having 2 to 20 carbon atoms. Exemplary aromatic heterocyclic groups and fused polycyclic aromatic heterocyclic groups are thienyl, furyl, pyrrolyl, pyridyl, quinolyl, and quinoxalyl groups.

The alkenyl groups represented by $R^1$ to $R^4$ are preferably substituted alkenyl groups having a phenyl group as at least one of the substituents, for example, 1- or 2-phenylalkenyl, 1,2- or 2,2-diphenylalkenyl, and 1,2,2-triphenylalkenyl groups, although unsubstituted alkenyl groups are acceptable.

Where the $R^1$ to $R^4$ groups have substituents, it is preferred that at least two of the substituents are aryl, amino, heterocyclic, alkenyl or aryloxy groups. These aryl, amino, heterocyclic and alkenyl substituents are the same as defined for $R^1$ to $R^4$. The aryloxy substituents are preferably those having an aryl group of 6 to 18 carbon atoms in total, for example, o-, m- or p-phenoxy. It is also acceptable that at least two of the substituents form a fused ring. These substituents may further have substituents, examples of which are as described above.

Where the $R^1$ to $R^4$ groups have substituents, it is preferred that at least two of the substituents have the above-described substituents. The substituted position is not critical and may be any of ortho, meta and para-positions. It is preferred that $R^1$ and $R^4$ are identical and $R^2$ and $R^3$ are identical, although they may be different.

Preferably at least five, more preferably at least six of $R^1$ to $R^8$ are substituted or unsubstituted alkyl, aryl, amino, alkenyl or heterocyclic groups.

$R^5$, $R^6$, $R^7$ and $R^8$ are hydrogen or substituted or unsubstituted alkyl, aryl, amino or alkenyl groups.

The alkyl groups represented by $R^5$ to $R^8$ are preferably those of 1 to 6 carbon atoms, which may be straight or branched. Preferred examples of the alkyl groups are methyl, ethyl, n- and i-propyl, n-, i-, sec- and tert-butyl, and n-, i-, neo- and tert-pentyl.

The aryl, amino and alkenyl groups represented by $R^5$ to R8 are as described for $R^1$ to $R^4$. It is preferred that $R^5$ and $R^6$ are identical and $R^7$ and $R^8$ are identical, although they may be different.

Also preferred are naphthacene compounds having a basic skeleton of the following formula (IV).

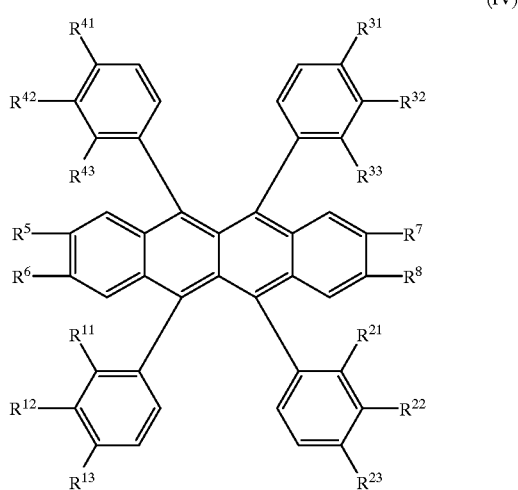

(IV)

In formula (IV), $R^{11}$ to $R^{13}$, $R^{21}$ to $R^{23}$, $R^{31}$ to $R^{33}$, and $R^{41}$ to $R^{43}$ are hydrogen, aryl, amino, heterocyclic, aryloxy or alkenyl groups. Preferably at least one of $R^{11}$ to $R^{13}$, has a and aryloxy groups. At least two of $R^{11}$ to $R^{13}$ may form a fused ring. Where all of $R^{11}$ to $R^{13}$ are hydrogen, it is preferred that any one of $R^5$, $R^6$, $R^7$ and $R^8$ has an alkyl or aryl group. The same applies to each set of $R^{21}$ to $R^{23}$, $R^{31}$ to $R^{33}$, and $R^{41}$ to $R^{43}$.

Preferred examples of the aryl, amino, heterocyclic, and aryloxy groups are the same as described for $R^1$ to $R^4$. It is preferred that $R^{11}$ to $R^{13}$ and $R^{41}$ to $R^{43}$ are identical and $R^{21}$ to $R^{23}$ and $R^{31}$ to $R^{33}$ are identical although they may be different.

The amino groups as the substituents on $R^{11}$ to $R^{13}$, $R^{21}$ to $R^{23}$, $R^{31}$ to $R^{33}$, and $R^{41}$ to $R^{43}$ may be alkylamino, arylamino or aralkylamino groups. These groups preferably have an aliphatic moiety of 1 to 6 carbon atoms in total and/or 1 to 4 aromatic carbocycles. Preferred examples of the amino groups include dimethylamino, diethylamino, dibutylamino, diphenylamino, ditolylamino, and bisdiphenylylamino groups.

Examples of the fused ring formed include indene, naphthalene, anthracene, phenanthrene, quinoline, isoquinoline, quinoxaline, phenazine, acridine, indole, carbazole, phenoxazine, phenothiazine, benzothiazole, benzothiophene, benzofuran, acridone, benzimidazole, coumarin, and flavone.

The buffer layer containing the porphyrin or naphthacene compound is formed by any well-known organic material depositing process such as evaporation. When the evaporation process is employed, the preferred conditions for vacuum evaporation include a vacuum of $10^{-4}$ Pa or lower and a deposition rate of about 0.01 to 1 nm/sec, though not critical. In vacuum, the buffer layer can be formed continuous to an organic layer (typically light emitting layer). It is preferred to successively form layers in vacuum because the successive formation in vacuum can avoid adsorption of impurities on the interface between the layers, thus ensuring better performance.

The buffer layer preferably has a thickness of 0.1 to 20 nm, more preferably 0.5 to 10 nm. If the thickness of the buffer layer exceeds this range, the electron injecting efficiency would decline or the porphyrin or naphthacene compound can reveal its own color.

After the buffer layer is deposited, the electron injecting electrode is deposited thereon.

The electron injecting electrode is preferably formed from materials having a low work function, for example, metal elements such as K, Li, Na, Mg, La, Ce, Ca, Sr, Ba, Al, Ag, In, Sn, Zn, and Zr, and binary or ternary alloys made of two or three such metal elements for stability improvement. Exemplary alloys are Ag—Mg (Ag: 0.1 to 50 at %), Al—Li (Li: 0.01 to 14 at %), In—Mg (Mg: 50 to 80 at %), and Al—Ca (Ca: 0.01 to 20 at %). Also useful are fluorides of alkali metals (such as Li, Na, K, Rb and Cs) such as LiF, NaF, KF, RbF and CsF, and oxides of these alkali metals such as $Li_2O$, $Na_2O$, $K_2O$, $Rb_2O$, and $Cs_2O$. Peroxides, compound oxides, and halides (other than fluorides) of alkali metals may also be used as well as nitrides and salts of alkali metals. A thin film of such a material or a multilayer film of two or more materials may be used as the electron injecting electrode layer.

It is especially preferred that the electron injecting electrode be formed of an aluminum-lithium alloy. The Al—Li alloy has a lithium content of 0.4 to 14 at %. The lithium content is preferably 0.4 to less than 6.5 at %, more preferably 0.4 to less than 5 at %, further preferably 0.4 to 4.5 at %, further preferably 0.4 to 4 at %, and most preferably 0.4 to 3 at %. Alternatively, the lithium content is preferably 6.5 to 14 at %, and more preferably 7 to 12 at %. With too high lithium contents, the electron injecting electrode deposited therefrom would lack stability. The objects of the invention cannot be attained with too low lithium contents. It is preferred to set the lithium content relatively high in order to enhance the stability of output luminance whereas it is recommended to set the lithium content relatively low in order to enhance the stability of drive voltage.

In addition to Al and Li, the alloy may contain at least one of Cu, Mg, Zr, Fe, Si and O as an additive or incidental impurity, in an amount of less than about 5% by weight for each.

The electron injecting electrode can be formed of an aluminum-lithium alloy to a graded structure having a lithium concentration varying in a thickness direction through the film such that lithium is concentrated near its interface with the organic layer and aluminum is concentrated near the opposite surface. The graded concentration enables that lithium element having a low work function be present in a high concentration at the interface with the organic layer where the electron injecting function is needed and lithium element having a high reactivity be present in a low concentration at the opposite surface where there is a more possibility of contact with the ambient atmosphere. As a consequence, the electron injecting electrode is improved in stability while maintaining a high electron injecting efficiency.

The electron injecting electrode having a graded concentration of lithium element can be readily formed, preferably by controlling the sputtering pressure. Alternatively, the graded concentration can be achieved by using both an Al—Li alloy target and an Al metal target and individually controlling the respective deposition rates. Instead of providing such a continuously graded concentration, a film in which the concentration of lithium is changed discontinuously or stepwise may be deposited.

Preferably the electron injecting electrode is deposited by sputtering. The sputtering process used may be a high-frequency sputtering process using an RF power supply. However, a DC sputtering process is preferred because the control of a deposition rate is easy and any damage to the organic EL structure can be reduced.

When the electron injecting electrode is deposited by sputtering, its adhesion at the interface with the organic layer is improved due to a surface migration effect because the sputtered atoms and groups have relatively high kinetic energy, as compared with the evaporation process. Since a surface oxide layer can be removed by pre-sputtering or moisture and oxygen adsorbed on the interface with the organic layer can be removed by back sputtering, a clean electrode-organic layer interface or electrode can be formed, leading to the manufacture of an organic EL device of higher quality and stability. Even when a mixture of materials having largely different vapor pressures is used as the target, there arises only a minimum difference in composition between the target and the deposited film. The sputtering process eliminates any limit on material as given by a vapor pressure in the case of evaporation. As compared with the evaporation process, the sputtering process eliminates a need to feed the material for a long period of time and improves the uniformity of film thickness and quality. This is advantageous from the viewpoint of productivity.

The electron injecting electrode formed by sputtering is a dense film which minimizes the ingress of moisture therein and has a high chemical stability as compared with the evaporated, coarse film. This leads to the manufacture of an organic EL device with a high efficiency and long lifetime.

The sputtering gas is preferably under a pressure of 0.1 to 5 Pa during sputtering. By changing the pressure of the sputtering gas during deposition, an electron injecting electrode having a graded concentration of metal elements can be formed.

The sputtering gas may be an inert gas such as He, Ar, Xe or Kr or nitrogen ($N_2$) as used in conventional sputtering apparatus. In the case of reactive sputtering, a reactive gas such as $H_2$, $O_2$, $C_2H_4$, and $NH_3$ may be used in combination with the inert gas.

The DC sputtering apparatus preferably has a power of 0.1 to 10 $W/cm^2$, especially 0.5 to 7 $W/cm^2$. A deposition rate of 0.1 to 100 nm/min, especially 1 to 30 nm/min is preferred.

The electron injecting electrode formed by sputtering sometimes contains the inert gas such as He, Ar, Xe or Kr or nitrogen used as the sputtering gas. The content of these sputtering gas elements is usually less than about 20 at %, preferably less than about 10 at %. The sputtering gas elements can be detected by gas emission upon heating, fluorescent x-ray analysis or electron probe microanalysis (EPMA).

The electron injecting electrode thin film may have a sufficient thickness to effect electron injection, for example, a thickness of at least 0.1 nm, preferably at least 0.5 nm, more preferably at least 1 nm. Although the upper limit is not critical, the film thickness is typically about 1 to about 500 nm. On the electron injecting electrode, an auxiliary or protective electrode may be provided, if desired.

The auxiliary electrode may have at least a sufficient thickness to ensure efficient electron injection and prevent the ingress of moisture, oxygen and organic solvents, for example, a thickness of at least 50 nm, preferably at least 100 nm, more preferably 100 to 500 nm. A too thin auxiliary electrode layer would exert its effect little, lose a step coverage capability, and provide insufficient connection to a terminal electrode. If too thick, greater stresses are generated in the auxiliary electrode layer, undesirably accelerating the growth rate of dark spots.

For the auxiliary electrode, an appropriate material may be chosen in consideration of the material of the electron injecting electrode to be combined therewith. For example, low resistivity metals such as aluminum may be used when the electron injection efficiency is of importance. Metal compounds such as TiN may be used when sealing is of importance.

The thickness of the electron injecting electrode and the auxiliary electrode combined is usually about 50 to about 500 nm though it is not critical.

Disposed below the buffer layer (and adjacent to the substrate) is an organic layer participating in at least a light emitting function. The organic layer includes a light emitting layer which is a single thin film or a laminate film of two or more thin films each formed of an organic compound having at least a light emitting function.

The light emitting layer has the functions of injecting holes and electrons, transporting them, and recombining holes and electrons to create excitons. It is preferred that relatively electronically neutral compounds be used in the light emitting layer because electrons and holes can be easily injected and transported in a well balanced manner.

In addition to the light emitting layer of a strictly defined sense, the organic layer may further include a hole injecting and transporting layer, an electron injecting and transporting layer, etc.

The hole injecting and transporting layer has the functions of facilitating injection of holes from the hole injecting electrode, transporting holes stably, and obstructing electrons. The electron injecting and transporting layer has the functions of facilitating injection of electrons from the electron injecting electrode, transporting electrons stably, and obstructing holes. These layers are effective for increasing the number of holes and electrons injected into the light emitting layer and confining holes and electrons therein for optimizing the recombination region to improve light emission efficiency.

The thicknesses of the light emitting layer, the hole injecting and transporting layer, and the electron injecting and transporting layer are not critical and vary with a particular formation technique. Usually, their thickness is preferred to range from about 5 nm to about 500 nm, especially about 10 nm to about 300 nm.

The thickness of the hole injecting and transporting layer and the electron injecting and transporting layer is equal to or ranges from about 1/10 times to about 10 times the thickness of the light emitting layer although it depends on the design of a recombination/light emitting region. When the electron or hole injecting and transporting layer is divided into an injecting layer and a transporting layer, preferably the injecting layer is at least 1 nm thick and the transporting layer is at least 1 nm thick. The upper limit of thickness is usually about 500 nm for the injecting layer and about 500 nm for the transporting layer. The same film thickness applies when two injecting/transporting layers are provided.

The light emitting layer of the organic EL device contains a fluorescent material that is a compound having a light emitting capability. The fluorescent material may be at least one member selected from compounds as disclosed, for example, in JP-A 63-264692, such as quinacridone, rubrene, and styryl dyes. Also, quinoline derivatives such as metal complex dyes having 8-quinolinol or a derivative thereof as the ligand such as tris(8-quinolinolato)aluminum are included as well as tetraphenylbutadiene, anthracene, perylene, coronene, and 12-phthaloperinone derivatives. Further useful are the phenylanthracene derivatives described in JP-A 8-12600 and the tetraarylethene derivatives described in JP-A 8-12969.

It is preferred to use such a compound in combination with a host material capable of light emission by itself, that is, to use the compound as a dopant. In this embodiment, the content of the compound in the light emitting layer is preferably 0.01 to 10% by weight, especially 0.1 to 5% by weight. By using the compound in combination with the host material, the light emission wavelength of the host material can be altered, allowing light emission to be shifted to a longer wavelength and improving the luminous efficacy and stability of the device.

As the host material, quinolinolato complexes are preferable, with aluminum complexes having 8-quinolinol or a derivative thereof as the ligand being more preferable. These aluminum complexes are disclosed in JP-A 63-264692, 3-255190, 5-70733, 5-258859 and 6-215874.

Illustrative examples include tris(8-quinolinolato)-aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Also useful are aluminum complexes having another ligand in addition to 8-quinolinol or a derivative thereof. Examples include bis(2-methyl-8-quinolinolato)(phenolato)-aluminum(III), bis(2-methyl-8-quinolinolato)(ortho-cresolato)aluminum(III), bis(2-methyl-8-quinolinolato)(meta-cresolato)aluminum(III), bis(2-methyl-8-quinolinolato)(para-cresolato)aluminum(III), bis(2-methyl-8-quinolinolato)-(ortho-phenylphenolato)aluminum (III), bis(2-methyl-8-quinolinolato)(meta-phenylphenolato) aluminum(III), bis(2-methyl-8-quinolinolato)(para-phenylphenolato)aluminum(III), bis(2-methyl-8-quinolinolato)(2,3-dimethylphenolato)-aluminum(III), bis (2-methyl-8-quinolinolato)(2,6-dimethyl-phenolato) aluminum(III), bis(2-methyl-8-quinolinolato)(3,4-dimethylphenolato)aluminum(III), bis(2-methyl-8-quinolinolato)(3,5-dimethylphenolato)aluminum(III), bis(2-methyl-8-quinolinolato)(3,5-di-tert-butylphenolato)-aluminum(III), bis(2-methyl-8-quinolinolato)(2,6-diphenyl-phenolato)aluminum(III), bis(2-methyl-8-quinolinolato)-(2, 4,6-triphenylphenolato)aluminum(III), bis(2-methyl-8-quinolinolato)(2,3,6-trimethylphenolato)aluminum(III), bis (2-methyl-8-quinolinolato)(2,3,5,6-tetramethylphenolato)-aluminum(III), bis(2-methyl-8-quinolinolato)(1-naphtholato)-aluminum(III), bis(2-methyl-8-quinolinolato) (2-naphtholato)-aluminum(III), bis(2,4-dimethyl-8-quinolinolato)(ortho-phenylphenolato)aluminum(III), bis(2, 4-dimethyl-8-quinolinolato)(para-phenylphenolato) aluminum(III), bis(2,4-dimethyl-8-quinolinolato)(meta-phenylphenolato)aluminum(III), bis(2,4-dimethyl-8-quinolinolato)(3,5-dimethylphenolato)-aluminum(III), bis (2,4-dimethyl-8-quinolinolato)(3,5-di-tert-butylphenolato)

aluminum(III), bis(2-methyl-4-ethyl-8-quinolinolato)(para-cresolato)aluminum(III), bis(2-methyl-4-methoxy-8-quinolinolato)(para-phenylphenolato)aluminum(III), bis(2-methyl-5-cyano-8-quinolinolato)(ortho-cresolato)aluminum(III), and bis(2-methyl-6-trifluoromethyl-8-quinolinolato) (2-naphtholato)aluminum(III).

Also acceptable are bis(2-methyl-8-quinolinolato)-aluminum(III)-μ-oxo-bis(2-methyl-8-quinolinolato) aluminum(III), bis(2,4-dimethyl-8-quinolinolato)aluminum (III)-μ-oxo-bis(2,4-dimethyl-8-quinolinolato)aluminum (III), bis(4-ethyl-2-methyl-8-quinolinolato)aluminum(III)-μ-oxo-bis(4-ethyl-2-methyl-8-quinolinolato)aluminum(III), bis(2-methyl-4-methoxyquinolinolato)aluminum(III)-μ-oxo-bis(2-methyl-4-methoxyquinolinolato)aluminum(III), bis(5-cyano-2-methyl-8-quinolinolato)aluminum(III)-μ-oxo-bis(5-cyano-2-methyl-8-quinolinolato)aluminum(III), and bis(2-methyl-5-trifluoromethyl-8-quinolinolato) aluminum(III)-μ-oxo-bis(2-methyl-5-trifluoromethyl-8-quinolinolato)aluminum(III).

Other useful host materials are the phenylanthracene derivatives described in JP-A 8-12600 and the tetraarylethene derivatives described in JP-A 8-12969.

The light emitting layer may also serve as the electron transporting layer. In this case, tris(8-quinolinolato) aluminum etc. are preferably used. These fluorescent materials may be evaporated.

Also, if necessary, the light emitting layer may also be a layer of a mixture of at least one hole injecting and transporting compound and at least one electron injecting and transporting compound, to which a dopant is preferably added. In such a mix layer, the content of the dopant is preferably 0.01 to 20% by weight, especially 0.1 to 15% by weight.

In the mix layer, carrier hopping conduction paths are created, allowing carriers to move through a polarly predominant material while injection of carriers of opposite polarity is rather inhibited, and the organic compound becomes less susceptible to damage, resulting in the advantage of an extended device life. By incorporating the aforementioned dopant in such a mix layer, the light emission wavelength the mix layer itself possesses can be altered, allowing light emission to be shifted to a longer wavelength and improving the luminous intensity and stability of the device.

The hole injecting and transporting compound and electron injecting and transporting compound used in the mix layer may be selected from the following hole injecting and transporting compounds and electron injecting and transporting compounds, respectively.

The electron injecting and transporting compound is preferably selected from quinoline derivatives and metal complexes having 8-quinolinol or a derivative thereof as a ligand, especially tris(8-quinolinolato)aluminum (Alq3). The aforementioned phenylanthracene derivatives and tetraarylethene derivatives are also preferable.

For the hole injecting and transporting layer, amine derivatives having intense fluorescence are useful, for example, triphenyldiamine derivatives, styrylamine derivatives, and amine derivatives having an aromatic fused ring.

The mix ratio is preferably determined in accordance with the carrier density and carrier mobility. It is usually preferred that the weight ratio of the hole injecting and transporting compound to the electron injecting and transporting compound range from about 1/99 to about 99/1, more preferably from about 10/90 to about 90/10, especially from about 20/80 to about 80/20.

Also preferably, the thickness of the mix layer ranges from the thickness of a mono-molecular layer to less than the thickness of the organic compound layer, specifically from 1 to 100 nm, more preferably 5 to 60 nm, especially 5 to 50 nm.

Preferably the mix layer is formed by a co-deposition process of evaporating the compounds from distinct sources. If both the compounds have approximately equal or very close vapor pressures or evaporation temperatures, they may be pre-mixed in a common evaporation boat, from which they are evaporated together. The mix layer is preferably a uniform mixture of both the compounds although the compounds can be present in island form. The light emitting layer is generally formed to a predetermined thickness by evaporating an organic fluorescent material or coating a dispersion thereof in a resin binder.

As the hole injecting and transporting compound, there may be used various organic compounds as described, for example, in JP-A 63-295695, 2-191694, 3-792, 5-234681, 5-239455, 5-299174, 7-126225, 7-126226, and 8-100172, and EP 0650955A1. Exemplary are tetraarylbenzidine compounds (triaryldiamines or triphenyldiamines: TPD), aromatic tertiary amines, hydrazone derivatives, carbazole derivatives, triazole derivatives, imidazole derivatives, oxadiazole derivatives having an amino group, and polythiophenes. Two or more of these compounds may be used, and on such combined use, they may be formed as separate layers or mixed.

As the electron injecting and transporting compound, there may be used quinoline derivatives including organic metal complexes having 8-quinolinol or a derivative thereof as a ligand such as tris(8-quinolinolato)aluminum (Alq3), oxadiazole derivatives, perylene derivatives, pyridine derivatives, pyrimidine derivatives, quinoxaline derivatives, diphenylquinone derivatives, and nitro-substituted fluorene derivatives.

In forming the hole injecting and transporting layer, the light emitting layer, and the electron injecting and transporting layer, vacuum evaporation is preferably used because homogeneous thin films are available. By utilizing vacuum evaporation, there is obtained a homogeneous thin film which is amorphous or has a crystal grain size of less than 0.1 μm. If the grain size is more than 0.1 μm, uneven light emission would take place and the drive voltage of the device must be increased with a substantial drop of charge injection efficiency.

The conditions for vacuum evaporation are not critical although a vacuum of $10^{-4}$ Pa or lower and a deposition rate of about 0.01 to 1 nm/sec are preferred. It is preferred to successively form layers in vacuum because the successive formation in vacuum can avoid adsorption of impurities on the interface between the layers, thus ensuring better performance. Also, the drive voltage of a device can be reduced and the development and growth of dark spots be restrained.

In the embodiment wherein the respective layers are formed by vacuum evaporation, where it is desired for a single layer to contain two or more compounds, boats having the compounds received therein are individually temperature controlled to achieve co-deposition.

Further preferably, a shield plate may be provided on the device in order to prevent the organic layers and electrodes from deterioration. In order to prevent the ingress of moisture, the shield plate is attached to the substrate through an adhesive resin layer for sealing. The sealing or filler gas is preferably an inert gas such as argon, helium, and nitrogen. The filler gas should preferably have a moisture content of less than about 100 ppm, more preferably less than about 10 ppm, especially less than about 1 ppm. The lower limit of the moisture content is usually about 0.1 ppm though not critical.

The shield plate is selected from plates of transparent or translucent materials such as glass, quartz and resins, with glass being especially preferred. Alkali glass is preferred because of economy although other glass compositions such as soda lime glass, lead alkali glass, borosilicate glass, aluminosilicate glass, and silica glass are also useful. Of these, plates of soda glass without surface treatment are inexpensive and useful. Metal plates and plastic plates may also be used as the shield plate.

Using a spacer for height adjustment, the shield plate may be held at a desired height over the layer structure. The spacer may be formed from resin beads, silica beads, glass beads, and glass fibers, with the glass beads being especially preferred. Usually the spacer is formed from particles having a narrow particle size distribution while the shape of particles is not critical. Particles of any shape which does not obstruct the spacer function may be used. Preferred particles have an equivalent circle diameter of about 1 to 20 $\mu$m, more preferably about 1 to 10 $\mu$m, most preferably about 2 to 8 $\mu$m. Particles of such diameter should preferably have a length of less than about 100 $\mu$m. The lower limit of length is not critical although it is usually equal to or more than the diameter.

When a shield plate having a recess is used, the spacer may be used or not. When used, the spacer should preferably have a diameter in the above-described range, especially 2 to 8 $\mu$m.

The spacer may be premixed in a sealing adhesive or mixed with a sealing adhesive at the time of bonding. The content of the spacer in the sealing adhesive is preferably 0.01 to 30% by weight, more preferably 0.1 to 5% by weight.

Any adhesive which can maintain stable bond strength and gas tightness may be used although UV-curable epoxy resin adhesives of cation curing type are preferred.

The substrate on which the organic EL structure is formed may be selected from amorphous substrates of glass and quartz and crystalline substrates of Si, GaAs, ZnSe, ZnS, GaP, and InP, for example. If desired, buffer layers of crystalline materials, amorphous materials or metals may be formed on such crystalline substrates. Metal substrates including Mo, Al, Pt, Ir, Au and Pd are also useful. Of these, glass substrates are preferred. Since the substrate is often situated on the light exit side, the substrate should preferably have a light transmittance as described above for the electrode.

A plurality of inventive devices may be arrayed on a plane. A color display is obtained when the respective devices of a planar array differ in emission color.

The substrate may be provided with a color filter film, a fluorescent material-containing color conversion film or a dielectric reflecting film for controlling the color of light emission.

The color filter film used herein may be a color filter as used in liquid crystal displays and the like. The properties of a color filter may be adjusted in accordance with the light emission of the organic EL device so as to optimize the extraction efficiency and color purity.

It is also preferred to use a color filter capable of cutting external light of short wavelength which is otherwise absorbed by the EL device materials and fluorescence conversion layer, because the light resistance and display contrast of the device are improved. An optical thin film such as a multilayer dielectric film may be used instead of the color filter.

The fluorescence conversion filter film is to convert the color of light emission by absorbing electroluminescence and allowing the fluorescent material in the film to emit light. It is formed from three components: a binder, a fluorescent material, and a light absorbing material.

The fluorescent material used may basically have a high fluorescence quantum yield and desirably exhibits strong absorption in the EL wavelength region. In practice, laser dyes are appropriate. Use may be made of rhodamine compounds, perylene compounds, cyanine compounds, phthalocyanine compounds (including sub-phthalocyanines), naphthalimide compounds, fused ring hydrocarbon compounds, fused heterocyclic compounds, styryl compounds, and coumarin compounds.

The binder is selected from materials which do not cause extinction of fluorescence, preferably those materials which can be finely patterned by photolithography or printing technique. Also, where the filter film is formed on the substrate so as to be contiguous to the hole injecting electrode, those materials which are not damaged during deposition of the hole injecting electrode (such as ITO or IZO) are preferable.

The light absorbing material is used when the light absorption of the fluorescent material is short and may be omitted if unnecessary. The light absorbing material may also be selected from materials which do not cause extinction of fluorescence of the fluorescent material.

Figure 2:
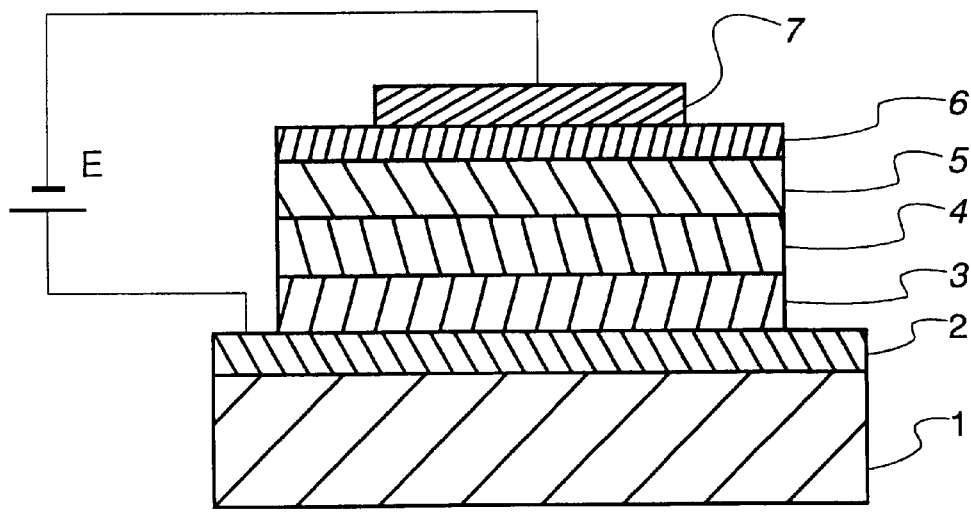
FIG. 2 is a schematic cross-sectional view illustrating the configuration of an organic EL device according to another embodiment of the invention.
Figure 3:
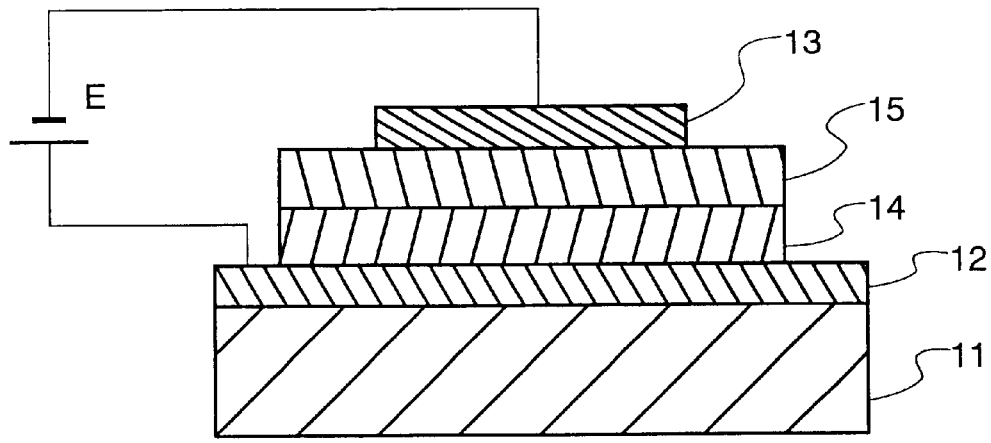
FIG. 3 is a schematic cross-sectional view illustrating a two-layer structure organic EL device.
Figure 4:
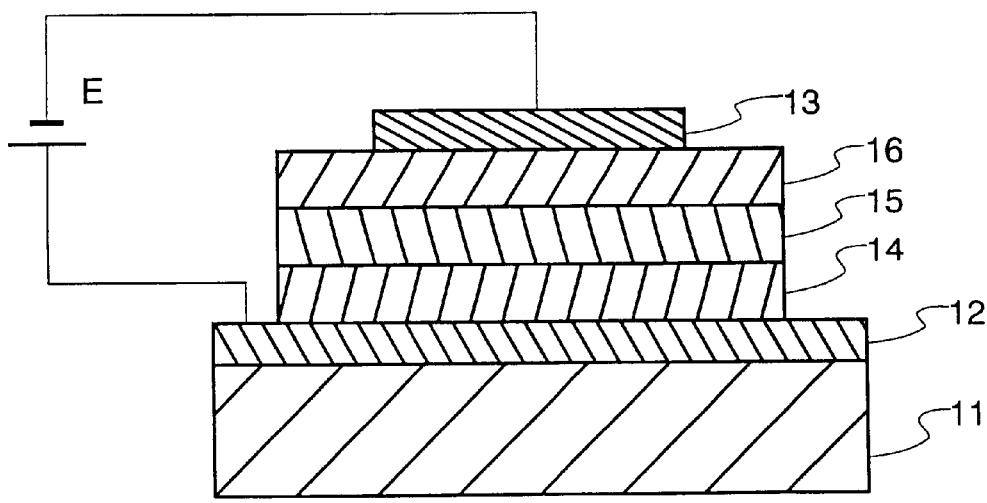
FIG. 4 is a schematic cross-sectional view illustrating a three-layer structure organic EL device.

As shown in FIG. 1, the organic EL device of the invention may have the successively stacked configuration of substrate 1/hole injecting electrode 2/hole injecting and transporting layer 3/light emitting layer 4/buffer layer 6/electron injecting electrode 7. As shown in FIG. 2, the device may have the successively stacked configuration of substrate 1/hole injecting electrode 2/hole injecting and transporting layer 3/light emitting layer 4/electron injecting and transporting layer 5/buffer layer 6/electron injecting electrode 7. Among such configurations, a choice may be properly made in accordance with the desired characteristics and performance of the device, and a modification may be made if necessary. In the configurations of FIGS. 1 and 2, a drive power supply E is connected between the hole injecting electrode 2 and the electron injecting electrode 7.

The organic EL device of the invention is generally of the dc or pulse drive type while it can be of the ac drive type. The applied voltage is generally about 2 to 30 volts.

EXAMPLE

Examples of the invention are given below by way of illustration and not by way of limitation.

Example 1

A substrate of (7059) glass by Corning Glass Works was scrubbed using a neutral detergent. The substrate was secured by a holder in a sputtering chamber which was evacuated to a vacuum. By DC magnetron sputtering from an ITO target, a hole injecting electrode of ITO having a thickness of 100 nm was formed on the substrate. The substrate having the patterned ITO electrode was subjected to ultrasonic washing with neutral detergent, acetone, and ethanol, pulled up from boiling ethanol, and dried. The surface was further cleaned with UV/ozone.

The substrate was secured by a holder in a vacuum evaporation chamber, which was evacuated to a vacuum of $1\times10^{-4}$ Pa or lower. By an evaporation process, 4,4',4"-tris(N-(3-methylphenyl)-N-phenylamino)triphenylamine (m-MTDATA) was evaporated at a deposition rate of 0.1 nm/sec to a thickness of 55 nm, forming a hole injecting layer. Then, N,N'-diphenyl-N,N'-m-tolyl-4,4'-diamino-1,1'-biphenyl (TPD) was evaporated at a deposition rate of 0.1 nm/sec to a thickness of 20 nm, forming a hole transporting layer. With the vacuum kept, tris(8-quinolinolato)aluminum (Alq3) was evaporated at a deposition rate of 0.1 nm/sec to a thickness of 50 nm, forming a light emitting layer. Next, copper phthalocyanine was evaporated at a deposition rate of 0.1 nm/sec to a thickness of 10 nm, forming a buffer layer (sample No. 1). Another sample (sample No. 2) was prepared by evaporating copper phthalocyanine to a thickness of 1 nm.

With the vacuum kept, by a sputtering process, AlLi (Li: 6 at %) was deposited to a thickness of 1 nm and Al was successively deposited to a thickness of 200 nm, forming an electron injecting electrode. Finally, a glass shield was sealed to the layer structure to complete an organic EL device.

For comparison purposes, an organic EL device (Comparative Sample) was similarly fabricated except that the buffer layer was omitted.

The organic EL device samples were measured for a light emission start voltage (that is, the voltage at which light emission was visually ascertainable), an output luminance at a constant current density of 10 mA/cm$^2$, and a drive voltage. The results are shown in Table 1.

Sample No. 1 and Comparative Sample were subject to an accelerated test of continuously driving at a constant current density of 100 mA/cm$^2$. The time passed until the development or growth of a dark spot having an equivalent circle diameter in excess of 100 μm was found was measured. The results are also shown in Table 1.

TABLE 1

| Sample | Light emission start voltage (V) | Luminance (cd/m$^2$) | Drive voltage (V) | Time until dark spot development (hr.) |
|---|---|---|---|---|
| No. 1 | 2.7 | 660 | 5.1 | 400 |
| No. 2 | 3.5 | 580 | 6.0 | — |
| Comparison | 4.1 | 560 | 6.6 | 200 |

As evident from Table 1, the samples within the scope of the invention show a low initial emission voltage and a low drive voltage and subsequently develop minimal dark spots.

Example 2

Organic EL devices were fabricated as in Example 1 except that the buffer layer was formed using phthalocyanine (free of the center metal). These devices were examined as in Example 1, finding equivalent results.

Example 3

Organic EL devices were fabricated as in Example 1 except that the buffer layer was formed using rubrene (i.e., 5,6,11,12-tetraphenylnaphthacene). These devices were examined as in Example 1, finding equivalent results.

Example 4

Organic EL devices were fabricated as in Example 1 except that the buffer layer was formed using 5,12-bis(biphenylyl)-6,11-diphenylnaphthacene. These devices were examined as in Example 1, finding equivalent results.

Equivalent results were obtained when the material of which the buffer layer was formed was replaced by 5,12-bis(2-naphthyl)-6,11-diphenylnaphthacene, 5,12-diphenyl-6,11-triphenylaminonaphthacene, 5,12-diphenyl-6,11-bis(triphenylethenyl)naphthacene, 2,3-dimethyl-5,6,11,12-tetraphenylnaphthacene, 2,3,5,6,11,12-hexaphenylnaphthacene, 6,11-bis(biphenylyl)-2,3,5,12-tetraphenylnaphthacene, and 5,12-bis(biphenylyl)-2,3,6,8,9,11-hexaphenylnaphthacene.

There have been described organic EL devices which can be manufactured without damages to organic layers, have a low initial drive voltage, a low emission start voltage, a high efficiency, and a long lifetime, and minimize the development of dark spots.

The invention has been described in detail with particular reference to preferred embodiments thereof, but it will be understood that variations and modifications can be effected within the spirit and scope of the invention.

What is claimed is:

1. An organic electroluminescent device comprising
   a substrate,
   a hole injecting electrode and an electron injecting electrode on the substrate, said electron injecting electrode comprising a metal, metal oxide or metal halide,
   an organic layer participating in at least a light emitting function disposed between the electrodes, and
   a buffer layer comprising a naphthacene compound disposed between said organic layer and said electron injecting electrode.

2. The organic electroluminescent device of claim 1 wherein said electron injecting electrode is formed by sputtering and composed of an aluminum-lithium alloy containing 0.4 to 14 at % of lithium.

3. The organic electroluminescent device of claim 1 wherein said electron injecting electrode is formed by sputtering and contains 6.5 to 14 at % of lithium.

4. The organic electroluminescent device of claim 1 wherein said buffer layer has a thickness of 0.1 to 20 nm.

5. An organic electroluminescent device comprising
   a substrate,
   a hole injecting electrode and an electron injecting electrode on the substrate, said electron injecting electrode comprising a metal, metal oxide or metal halide,
   an organic layer participating in at least a light emitting function disposed between the electrodes, and
   a buffer layer comprising a porphyrin or naphthacene compound disposed between said organic layer and said electron injecting electrode,
   wherein said electron injecting electrode is formed by sputtering and composed of an aluminum-lithium alloy containing 0.4 to 14 at % of lithium.

6. The organic electroluminescent device of claim 5 and wherein said electron injecting electrode is formed by sputtering and contains 6.5 to 14 at % of lithium.

7. The organic electroluminescent device of claim 5 wherein said buffer layer has a thickness of 0.1 to 20 nm.

8. The organic electroluminescent device of claim 5 wherein the aluminum lithium alloy is of a graded structure having a lithium concentration varying in a thickness direction through the film such that lithium is concentrated near its interface with the organic layer and aluminum is concentrated near the opposite surface.

* * * * *